United States Patent
Boivin et al.

(10) Patent No.: US 9,735,353 B2
(45) Date of Patent: Aug. 15, 2017

(54) PHASE-CHANGE MEMORY CELL HAVING A COMPACT STRUCTURE

(71) Applicants: STMicroelectronics (Crolles 2) SAS, Crolles (FR); STMicroelectronics (Rousset) SAS, Rousset (FR)

(72) Inventors: Philippe Boivin, Venelles (FR); Simon Jeannot, Grenoble (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/098,025

(22) Filed: Apr. 13, 2016

(65) Prior Publication Data

US 2016/0380190 A1 Dec. 29, 2016

(30) Foreign Application Priority Data

Jun. 23, 2015 (FR) ...................... 15 55733

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *H01L 27/2436* (2013.01); *H01L 45/1206* (2013.01);
(Continued)

(58) Field of Classification Search
CPC ..... H01L 45/06; H01L 45/16; H01L 45/1206; H01L 45/1226; H01L 27/2436; H01L 45/1608

See application file for complete search history.

(56) References Cited

U.S. PATENT DOCUMENTS 8,471,233 B2* 6/2013 Aozasa ................ H01L 27/101
257/2
8,698,118 B2* 4/2014 Toh ......................... H01L 45/04
257/2
(Continued)

FOREIGN PATENT DOCUMENTS

EP 1 845 567 A1 10/2007
JP 9-82912 A 3/1997

OTHER PUBLICATIONS

Gambino et al, "Silicides and ohmic contacts", Mats. Chem. and Phys. 52 (1998) 99-146.*

(Continued)

*Primary Examiner* — A. Sefer
*Assistant Examiner* — Vincent Wall
(74) *Attorney, Agent, or Firm* — Seed IP Law Group LLP (57) ABSTRACT

A memory cell includes a selection transistor having a control gate and a first conduction terminal connected to a variable-resistance element. The memory cell is formed in a wafer comprising a semiconductor substrate covered with a first insulating layer, the insulating layer being covered with an active layer made of a semiconductor. The gate is formed on the active layer and has a lateral flank covered with a second insulating layer. The variable-resistance element includes a first layer covering a lateral flank of the active layer in a trench formed through the active layer along the lateral flank of the gate and reaching the first insulating layer, and a second layer made of a variable-resistance material.

21 Claims, 4 Drawing Sheets

(52) U.S. Cl.
CPC .......... *H01L 45/1226* (2013.01); *H01L 45/16* (2013.01); *G11C 13/0004* (2013.01); *G11C 2213/79* (2013.01); *G11C 2213/82* (2013.01)

(56) References Cited

U.S. PATENT DOCUMENTS

| | | |
|---|---|---|
| 2010/0032641 A1 | 2/2010 | Mikawa et al. |
| 2012/0243307 A1* | 9/2012 | Takashima .......... H01L 27/2436 365/163 |
| 2015/0144862 A1* | 5/2015 | Choi .................. H01L 45/1253 257/4 |

OTHER PUBLICATIONS

Deng et al., "Salicidation process using NiSi and its device application", J. Appl. Phys. 81 (12) 1997 8047-8051.*

* cited by examiner

PHASE-CHANGE MEMORY CELL HAVING A COMPACT STRUCTURE

BACKGROUND

Technical Field

The present disclosure relates to phase-change memories, and more generally memories in which each memory cell comprises a selection transistor and a variable-impedance element which is able to exhibit a number of different states detectable by an impedance measurement. Depending on whether the element is able to preserve its state when its power supply is turned off, the memory is either volatile or nonvolatile.

Description of the Related Art

Figure 1A:
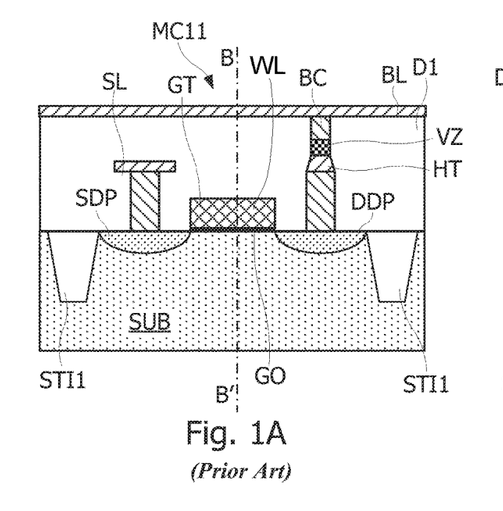
FIGS. 1A and 1B, described above, schematically show in transverse and longitudinal cross sections, respectively, a semiconductor substrate in which has been formed a conventional memory cell comprising a variable-resistance element.
Figure 1B:
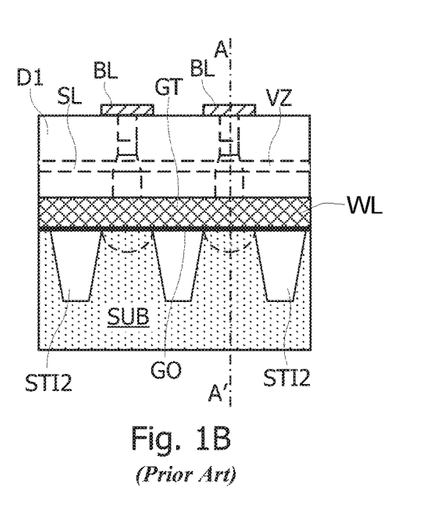

FIGS. 1A and 1B schematically show in cross section a semiconductor substrate SUB on which has been formed a memory cell MC11 comprising a variable resistance element VZ. FIG. 1A is a longitudinal cross-sectional view of the plane AA' indicated in FIG. 1B, and FIG. 1B is a transverse cross-sectional view of the plane BB' indicated in FIG. 1A. The memory cell MC11 comprises a selection transistor comprising a gate GT, (drain or source) conduction regions DDP and SDP on either side of the gate GT, and a channel region under the gate GT between the conduction regions DDP, SDP. The gate GT is produced in a layer made of poly silicon formed on an insulating layer GO deposited on the substrate SUB. The regions DDP, SDP are formed by implanting dopants into the substrate SUB on each side of the gate GT. The memory cell MC11 is covered with a dielectric insulator DI. The conduction region SDP is connected to a source line SL by way of a via passing through the insulating layer D1. The gate GT forms a word line WL lying parallel to the source line SL. The variable-resistance element VZ is formed in the insulating layer D1 and is connected to the conduction region DDP by way of a via formed in the insulating layer D1. The variable-resistance element VZ is connected to a bit line BL formed on the surface of the insulating layer DI by way of a via BC formed in the insulating layer D1. The bit line BL runs perpendicular to the word line WL and source line SL. The memory cell is isolated from adjacent memory cells (or other circuit elements formed on the substrate SUB) by shallow trench isolations STI1 parallel to the gate GT, and shallow trench isolations STI2 perpendicular to the gate GT. The trench isolations STI1 may be replaced by transistor gates (such as the gate GT) that are biased so as to maintain the associated transistor in the off state (not shown).

The variable-resistance element VZ is made of a material able to pass from an amorphous phase to a crystalline phase and vice versa, under the effect of heat. In its amorphous form, the element VZ has a high resistance, and in the crystalline form its resistance is low. The element VZ is therefore associated in series with a heating element HT that heats up under the effect of a current flow. The amorphous form is obtained by applying a current peak to the heating element HT, whereas the crystalline form is obtained by a slower cooling of the element VZ achieved by gradually decreasing the current flowing through the heating element HT. Certain phase-change materials may be controlled to exhibit more than two phases having different resistances, thereby making it possible to store a plurality of bits in a single memory cell.

Figure 2:
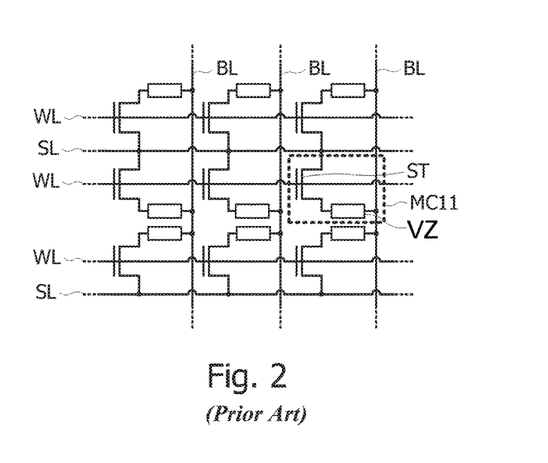
FIG. 2, described above, schematically shows the electric circuit of one portion of a memory plane comprising memory cells containing a variable-resistance element, such as that in FIGS. 1A and 1B.

FIG. 2 shows the electric circuit of one portion of a memory plane comprising memory cells such as the memory cell MC11 shown in FIGS. 1A and 1B. The memory plane comprises word lines WL, source lines SL parallel to the word lines WL and bit lines perpendicular to the word lines WL and to the source lines SL. Each memory cell MC11 comprises a selection transistor ST comprising a (source or drain) conduction terminal connected to one terminal of a variable-resistance element VZ the other terminal of which is connected to one of the bit lines BL. The other conduction terminal of the selection transistor ST is connected to one of the source lines SL, and the gate terminal of the transistor ST is connected to one of the word lines WL.

To decrease the area occupied by each memory cell, it has been proposed to produce the memory cells in pairs sharing one and the same conduction region SDP connected to one source line SL, as in FIG. 2. In this embodiment, the trench isolation STI1 to the left in FIG. 1A is replaced by a gate, such as the gate GT, forming the gate of the selection transistor of the other memory cell of the pair of memory cells.

It would be desirable to further decrease the substrate area occupied by a memory cell comprising a variable-resistance element.

BRIEF SUMMARY

Embodiments relate to a memory cell comprising a selection transistor having a control gate and a first conduction terminal connected to a variable-resistance element, the memory cell being formed in a wafer comprising a semiconductor substrate covered with a first insulating layer, the insulating layer being covered with an active layer made of a semiconductor, the gate being formed on the active layer and having a lateral flank covered with a second insulating layer, the variable-resistance element comprising a first layer covering a lateral flank of the active layer in a trench formed through the active layer along the lateral flank of the gate and reaching the first insulating layer, and a second layer made of a variable-resistance material.

According to one embodiment, the first and second layers form one and the same layer.

According to one embodiment, the first layer covers a lateral flank of a conductive trench.

According to one embodiment, an upper portion of the first layer makes contact with a conductive layer lying in a plane parallel to the surface of the substrate.

According to one embodiment, the first layer covers a lateral flank of a trench isolation formed under the conductive layer.

According to one embodiment, the second layer lies in a plane parallel to the surface of the substrate and makes contact with an upper portion of the first layer that provides a heating-element function for heating the second layer in order to make it change phase between a very poorly conductive amorphous phase and a very conductive crystalline phase.

Embodiments may also relate to a memory comprising at least two memory cells such as defined above, the control gate of each memory cell being connected to a word line of the memory, the variable-resistance element of each memory cell being connected to a bit line of the memory, and the selection transistor of each memory cell comprising a second conduction terminal connected to a source line of the memory.

According to one embodiment, the variable-resistance elements of the two memory cells are formed in the trench and are separated from each other by the conductive trench, which is connected to one and the same bit line.

According to one embodiment, the second conduction terminal of each memory cell is shared with another memory cell of the memory.

Embodiments may also relate to a process for fabricating an integrated circuit comprising a memory cell, the process comprising steps consisting in: forming a selection transistor on a semiconductor substrate covered with a first insulating layer, the insulating layer being covered with an active layer made of a semiconductor, the selection transistor comprising a control gate and first and second conduction terminals; covering with a second insulating layer a lateral flank of the control gate on the same side as the first conduction terminal; producing a first trench through the active layer in the first conduction terminal, reaching the first insulating layer; depositing a first layer in the first trench, covering a lateral flank of the active layer in the trench; and depositing a second layer made of a variable-resistance material.

According to one embodiment, the first and second layers form one and the same layer.

According to one embodiment, the process comprises steps of depositing on a lateral flank of the first layer a third insulating layer, and of etching a second trench in the first layer along the third insulating layer, until the first insulating layer is reached.

According to one embodiment, the process comprises a step of filling the second trench with a conductor in order to form a conductive trench.

According to one embodiment, the process comprises steps of filling the second trench with an insulator and of depositing on the second trench a conductor making contact with the first layer made of a variable-resistance material.

According to one embodiment, the second layer lies in a plane parallel to the surface of the substrate and makes contact with an upper portion of the first layer that provides a heating-element function for heating the second layer in order to make it change phase between a very poorly conductive amorphous phase and a very conductive crystalline phase.

BRIEF DESCRIPTION OF THE SEVERAL VIEWS OF THE DRAWINGS

Nonlimiting exemplary embodiments of the disclosure will be described below with reference to the appended figures, in which.

DETAILED DESCRIPTION

Figure 3A:
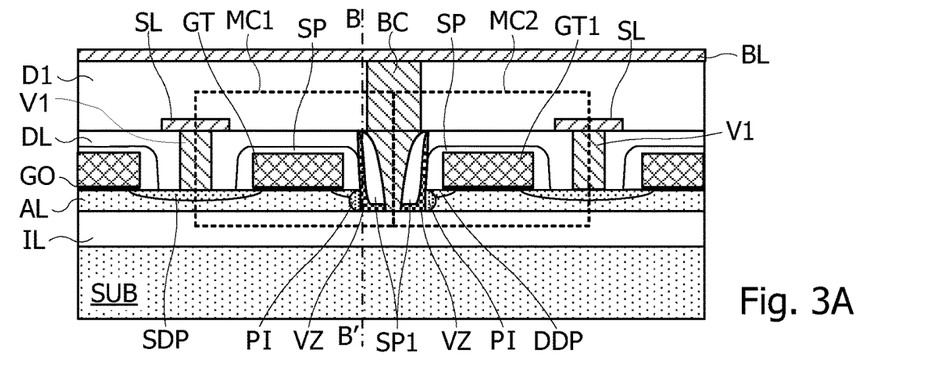
FIGS. 3A, 3B and 3C schematically show a semiconductor substrate in which are formed memory cells comprising a variable-resistance element, according to one embodiment, in transverse cross section, in longitudinal cross section and from above, respectively.
Figure 3B:
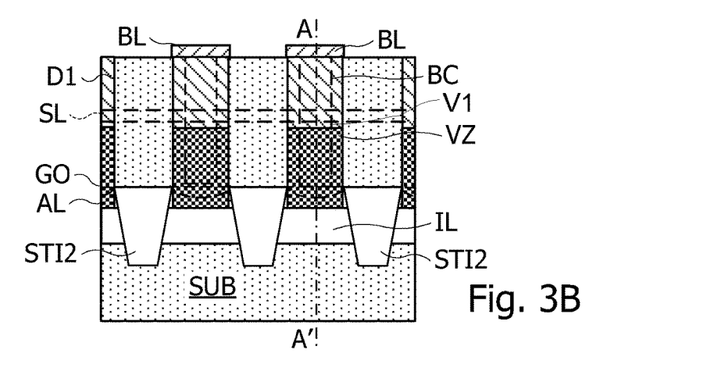
Figure 3C:
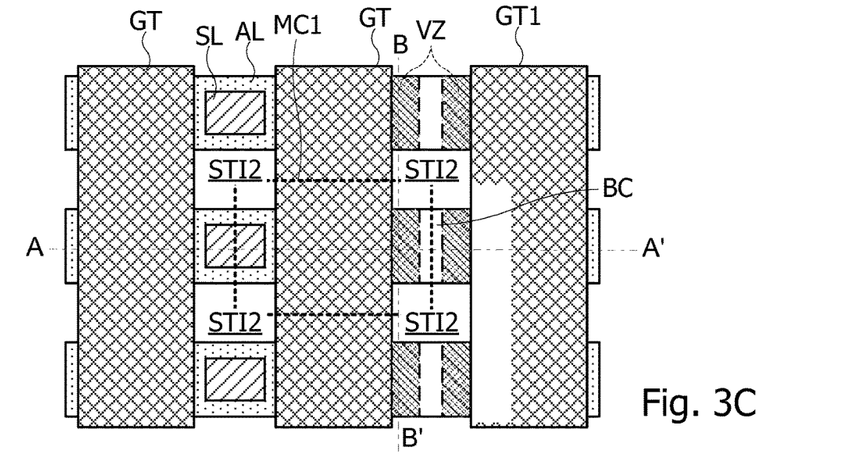

FIGS. 3A, 3B and 3C show a semiconductor substrate SUB on which has been formed a memory cell MC1 comprising a variable-resistance element VZ, according to one embodiment. FIG. 3A is a cross-sectional view of the plane AA' indicated in FIG. 3B, and FIG. 3B is a cross-sectional view of the plane BB' indicated in FIG. 3A. The substrate SUB is a silicon-on-insulator (SOI) substrate and comprises an insulating layer IL formed on one side of the substrate SUB and an active layer AL made of a semiconductor, for example of silicon, formed on the insulating layer IL. The substrate SUB may be a fully depleted SOI (FDSOI) substrate.

The memory cell MC1 contains a selection transistor comprising a gate GT formed on the substrate SUB, and conduction regions SDP and DDP formed on the two sides of the gate GT, respectively. The gate GT is made of a conductor such as doped polysilicon, on an insulating layer GO, for example of the oxide $SiO_2$, deposited on the active layer AL. The gate GT forms a channel region between the regions DDP and SDP. The regions SDP and DDP are produced by implanting dopants into the active layer AL. The region SDP thus forms a conduction region common to the selection transistors of the memory cell MC1 and of an adjacent memory cell. A via connects the region SDP to a source line SL. The gate GT is covered with a dielectric layer SP forming spacers on the lateral flanks of the gate GT. The memory cell MC1 is covered with one or more layers DL, D1 made of a dielectric insulator that may also be the oxide $SiO_2$ or a metal oxide.

According to one embodiment, a trench is produced between the spacers SP of the gate GT and an adjacent gate GT1, through the active layer AL in the region DDP, until the insulating layer IL is reached. A layer made of a variable-resistance material is deposited and etched so as to form variable-resistance elements VZ covering the spacers SP, a portion of the bottom of the trench between the spacers SP, and in particular lateral flanks of the active layer AL in the trench. Beforehand, barriers PI impermeable to the diffusion of species present in the layer VZ towards the active layer AL are produced, for example by siliciding the silicon forming the active layer AL. The barriers PI make it possible to prevent the material forming the layer VZ from polluting the active layer AL forming the selection transistor. Spacers SP1 are formed on the lateral flanks of the trench covered with the variable-resistance elements VZ. The trench is filled with a conductor so as to form a conductive trench BC reaching the insulating layer IL between the variable-resistance elements VZ, without making contact with the upper portion of the elements VZ.

In FIGS. 3B and 3C, adjacent memory cells are isolated from each other by adjacent trench isolations STI2 formed in the active layer AL and reaching the insulating layer IL. The conductive trench BC and the variable-resistance elements VZ are cut into sections above the trench isolation STI2, in order to isolate each memory cell from adjacent memory cells located beyond adjacent trench isolations STI2, and thus prevent conductive filaments from forming between two bit lines BL within the material forming the elements VZ.

The variable-resistance layer VZ may be made of a chalcogenide glass such as GST, an alloy of germanium, antimony and tellurium ($Ge_2Sb_2Te_5$). If a sufficiently high current is applied thereto, this material gets hot and may therefore change phase between an amorphous phase and a crystalline phase depending on the cooling rate applied to the material. There is therefore no need for the latter to be associated with a heating element.

By virtue of these arrangements, the layer made of variable-resistance material forms a variable-resistance element VZ both for the memory cell MC1 and the adjacent memory cell MC2 comprising the gate GT1. Thus, the memory cell structure just described makes it possible to obtain a relatively substantial saving in substrate area by virtue of the fact that the connection to the bit line BL of the variable-resistance elements of adjacent memory cells MC1 and MC2 is shared by the two memory cells. Relative to the structure shown in FIGS. 1A and 1B, the memory cell structure shown in FIGS. 3A to 3C allows a saving in substrate area of about 29% while preserving the dimensions of the constituent elements of the memory cells.

Figure 4A:
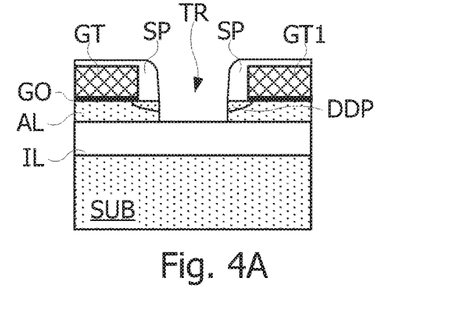
FIGS. 4A to 4D schematically show in transverse cross section a semiconductor substrate at various stages of fabrication of a memory cell such as the cell in FIG. 3A, according to one embodiment.

FIGS. 4A to 4D show a portion of the substrate SUB on which has been formed a pair of memory cells. FIG. 4A shows the substrate after the gates GT, GT1 have been formed and spacers SP formed on the lateral flanks of the gates GT, GT1. In a fabrication step illustrated by FIG. 4A, a trench TR is formed in the active layer AL between the spacers SP formed along the gates GT, GT1, the trench TR being produced so as to reach the insulating layer IL.

Figure 4B:
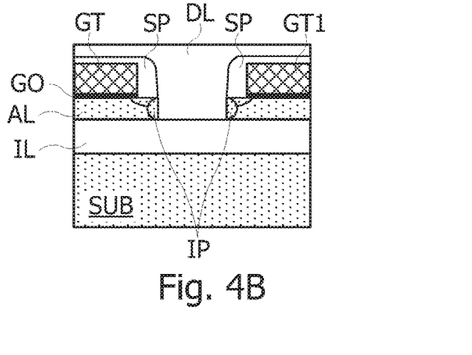

In the following fabrication steps, illustrated by FIG. 4B, the flanks of the trench TR in the active layer AL are insulated, so as to form insulating elements IP in the active layer AL in the vicinity of the lateral flanks of the trench TR. This operation is for example carried out by nitriding the silicon forming the active layer AL. The substrate SUB is then covered with a dielectric layer DL, including in the trenches TR. The layer DL is for example made of a metal oxide.

Figure 4C:
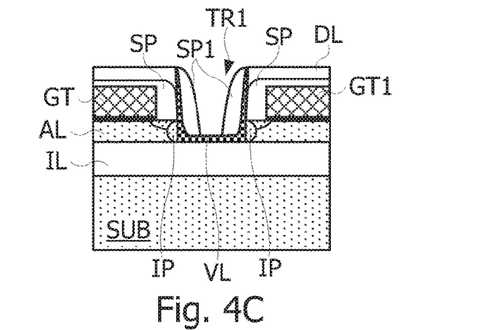

In the following fabrication steps, illustrated by FIG. 4C, the layer DL is etched so as to form a trench TR1 corresponding to the trench TR, while leaving behind a portion of the layer DL on the gates GT, GT1. The surface of the substrate and the trenches TR1 are then covered with a layer VL of substantially uniform thickness of the material intended to form the variable-resistance elements. Spacers SP1 are formed on the flanks of the trench TR1 covered with the layer VL, which is for example made of GST.

Figure 4D:
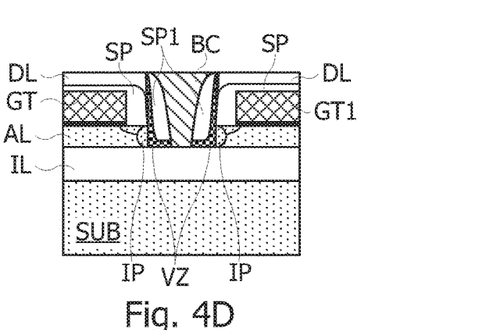

In the following fabrication steps, illustrated by FIG. 4D, the layer VL not covered with the spacers SP1 is etched until the insulating layer at the bottom of the trench TR1 is reached between the spacers SP1, so as to singulate the variable-resistance elements VZ. The formation of the spacers SP, SP1 makes it possible to ensure that the region exposed at the bottom of the trench TR1 is centered between the gates GT, GT1. The trench TR1 is then filled with a conductor in order to form a conductive trench BC. For this purpose, the walls and the bottom of the trench TR1 may for example be covered with a conductive layer of substantially uniform thickness, for example made of titanium or titanium nitride. The trench TR1 may then be filled with a metal such as tungsten or copper. In the following steps, vias V1 (see FIG. 3A) connecting the regions SDP may be formed in the layer DL, and source lines SL connected to the vias V1 may be formed on the layer DL. All of the substrate (layer DL and source lines SL) is covered with the dielectric layer D1 (FIG. 3C), which is then etched in order to form therein a via connecting the conductive trench BC to a bit line BL. The layers DL, D1 may be made of PMD (polysilicon metal dielectric).

Figure 5:
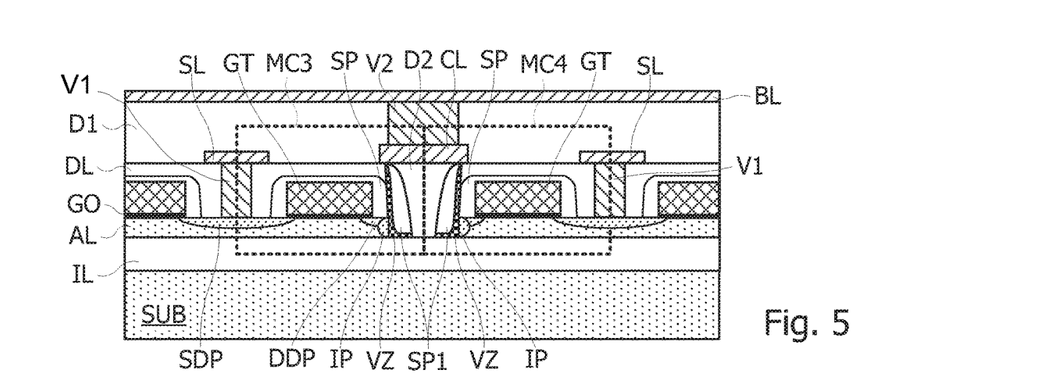
FIGS. 5 and 6 schematically show in transverse cross section a semiconductor substrate in which are formed memory cells comprising a variable-resistance element, according to other embodiments.

FIG. 5 shows a semiconductor substrate SUB on which have been formed memory cells MC3, MC4, each comprising a variable-resistance element VZ, according to another embodiment. The memory cells MC3, MC4 differ from the memory cells MC1, MC2 in that the trench TR1 between the spacers SP1 is filled with a dielectric material D2, and a conductive layer CL is formed above the trench TR1 on the material D2, so as to make electrical contact with an upper region of the elements VZ. The layer CL may be connected to a bit line BL by a via V2. It will be noted that the via V2 may directly connect the element VZ to the bit line BL. The layer D2 may be made of PMD.

Figure 6:
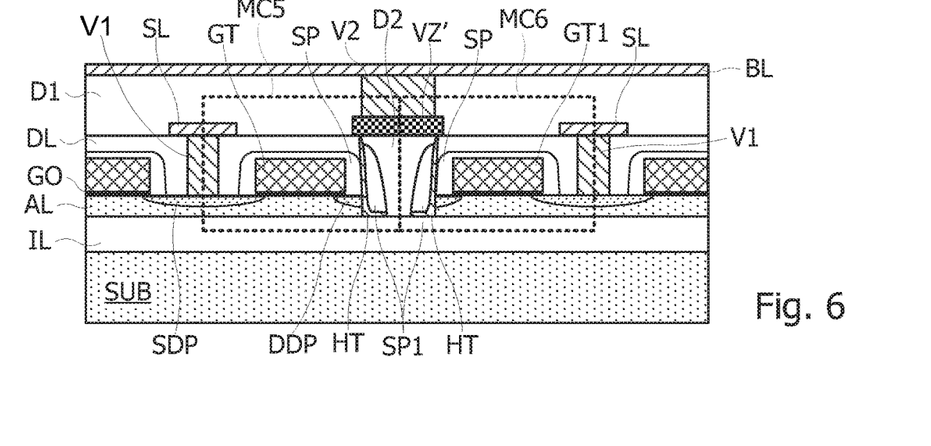

FIG. 6 shows a semiconductor substrate SUB on which have been formed memory cells MC5, MC6 sharing one and the same variable-resistance element VZ', according to another embodiment. The memory cells MC5, MC6 differ from the memory cells MC3, MC4 in that the variable-resistance elements VZ of the memory cells MC3, MC4 are replaced by heating elements HT of the same form and that are therefore able to be produced in the same way, simply by replacing the layer VL with a layer made of a resistive material that dissipates heat at the voltages liable to be applied between the source-line SL and bit-line BL contacts of a given memory cell. The conductive layer CL of the memory cells MC3, MC4 is also replaced by the variable-resistance element VZ' formed in a layer made of a variable-resistance material. The element VZ' is produced so as to make electrical contact with an upper portion of each of the heating elements HT of the memory cells MC5, MC6. In this way, when one of the memory cells MC5, MC6 must be programmed or erased, a current is made to flow through the element HT of the memory cell and through the element VZ', thereby heating the heating element HT. This results in the element VZ' being heated locally by the element HT in a region located in the vicinity of the zone of contact with the heating element HT. As a result, this region may change state between the crystalline phase and the amorphous phase. The regions of the variable-resistance layer of the element VZ' in the vicinity of the zone of contact with one of the heating elements HT of the memory cells MC5, MC6 are sufficiently far from each other that, if one of these regions changes (amorphous/crystalline) phase, the other of these regions does not change phase.

It will be noted that in the embodiment illustrated in FIG. 6, it is not necessary to form the insulating elements IP since the GST does not make contact with a semiconductor such as that of the active layer AL.

In the embodiments in FIGS. 5 and 6, the spacers SP1 may be omitted since it is not necessary to center the elements relative to one another.

Figure 7:
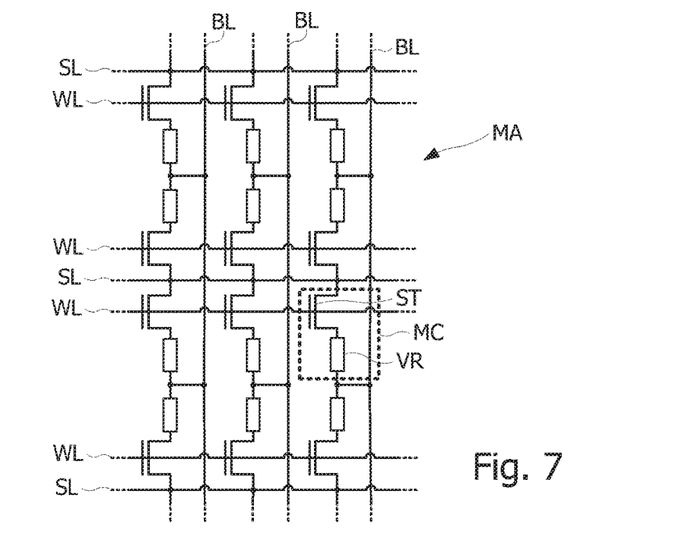
FIG. 7 schematically shows the electric circuit of one portion of a memory plane comprising memory cells containing a variable-resistance element, such as those in FIG. 3A, 5 or 6.

FIG. 7 schematically shows the electric circuit of one portion of a memory plane MA comprising memory cells MC containing a variable-resistance element VR, such as the memory cell MC1, MC3 or MC5. The memory plane MA comprises bit lines BL, word lines WL perpendicular to the bit lines BL and source lines SL perpendicular to the bit lines BL. Each memory cell MC comprises a selection transistor ST and a variable-resistance element VR such as the element VZ shown in FIG. 3A or 5, or the combination of a heating element HT with the layer VZ' shown in FIG. 6. The transistor ST comprises a (source or drain) conduction terminal connected to one terminal of the variable-resistance element VR the other terminal of which is connected to one of the bit lines BL. The other (drain or source) conduction terminal of the selection transistor ST is connected to one of the source lines SL. The transistor ST comprises a gate terminal connected to one of the word lines WL. The resistance of the element VR may be changed between a highly resistant state when the material forming the element VR is placed in an amorphous phase and a weakly resistant state when the material forming the element VR is placed in a crystalline phase.

Relative to the memory plane in FIG. 2, a substantial saving in substrate area is obtained because each memory cell of the memory plane MA shares a point of connection to a bit line BL with another memory cell of the memory plane, in addition to sharing a point of connection to a source line SL of another memory cell.

It will be noted that the conduction regions DDP, SDP of the selection transistor ST may irrespectively form a drain terminal and a source terminal of the transistor, and that the functions of the bit line BL and source line SL may be inverted.

The various memory cell embodiments described above may be produced on an FDSOI (fully depleted SOI) type substrate, with an active layer AL and an insulating layer IL of thicknesses of about 7 nm and 25 nm, respectively. The substrate employed may also be a PDSOI (partially depleted SOI) type substrate, with an active layer AL and an insulating layer IL of thicknesses of about 25 nm and 100 nm, respectively.

It will be clearly apparent to those skilled in the art that various variant embodiments of the present disclosure are possible and that it has various applications. In particular, the disclosure is not limited to a memory, but also encompasses a single memory cell formed in an SOI substrate. In this case in particular, it is not necessary to provide for self-centering of the contact BC in the variable-resistance material, since only a single variable-resistance element will be produced.

It will also be noted that the memory cell may be produced on a conventional semiconductor substrate on which an insulating layer (IL) has been deposited, the semiconductor layer AL being formed on the insulating layer, for example by epitaxy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory cell comprising:
a semiconductor substrate;
a first insulating layer covering a surface of the semiconductor substrate;
an active layer of semiconductor material covering the first insulating layer;
a control gate of a selection transistor, the control gate being formed on the active layer and having a lateral flank;
a trench formed through the active layer, the trench being defined on one side by a lateral flank of the active layer and defined on a bottom side by a top side of the first insulating layer;
a second insulating layer covering the lateral flank of the control gate; and
a variable-resistance element electrically coupled to a first conduction terminal of the selection transistor,
wherein the variable-resistance element is at least partially in the trench and contacting the lateral flank of the active layer in the trench.

2. The memory cell according to claim 1, further comprising:
a trench conductor having a lateral flank, the variable resistance element between the lateral flank of the trench conductor and the lateral flank of the active layer.

3. The memory cell according to claim 1, further comprising:
a conductive layer, contacts an upper portion of the variable-resistance element, and extends longitudinally in a plane parallel to the surface of the substrate.

4. The memory cell according to claim 3, comprising a dielectric trench isolation formed under the conductive layer and having a lateral flank covered by the variable-resistance element.

5. The memory cell according to claim 1, further comprising a silicide barrier positioned between the active layer and the variable-resistance element.

6. The memory cell according to claim 2, further comprising:
a spacer between a wall of the variable resistance element and the trench conductor.

7. A memory comprising:
a plurality of wordlines;
a plurality of bit lines;
a plurality of source lines;
a semiconductor substrate;
a first insulating layer covering a surface of the semiconductor substrate;
a semiconductor active layer covering the first insulating layer; and
at least two memory cells, each of the memory cells including:
a selection transistor that includes a control gate and a first conduction terminal, the control gate being formed on the active layer, having a lateral flank, and being electrically coupled to one of the word lines;
a trench formed through the active layer, the trench being defined on one side by a lateral flank of the active layer and defined on a bottom side by a top side of the first insulating layer;
a second insulating layer covering the lateral flank of the control gate; and
a variable-resistance element electrically coupled to the first conduction terminal of the selection transistor, wherein the variable-resistance element is at least partially in the trench and contacting the lateral flank of the active layer in the trench, the conduction terminal of the selection transistor being electrically coupled to one of the bit lines through the variable-resistance element.

8. The memory according to claim 7, in which:
the at least two memory cells include first and second memory cells, a conductive layer on the variable-resistance elements of the first and second memory elements as a shared trench conductor electrically coupled to one of the same bit lines.

9. The memory according to claim 7, in which a second conduction terminal of the selection transistor of each memory cell is shared with another memory cell of the memory.

10. The memory according to claim 7, in which each of the at least two memory cells includes a trench conductor having a lateral flank covered by the variable-resistance element.

11. The memory according to claim 7, further comprising:
a conductive layer in contact with an upper portion of the variable-resistance element, and extends longitudinally in a plane parallel to the surface of the substrate.

12. The memory according to claim 11, wherein each memory cell includes a dielectric trench isolation formed under the conductive layer of the memory cell and having a lateral flank covered by the variable-resistance element of the memory cell.

13. The memory according to claim 8, further comprising:
a first silicide barrier positioned between the active layer and the variable-resistance element of the first memory cell, the first silicide barrier being impermeable to diffusion of species present in the variable-resistance element of the first memory cell towards the active layer; and
a second silicide barrier positioned between the active layer and the variable-resistance element of the second memory cell, the second silicide barrier being impermeable to diffusion of species present in the variable-resistance element of the second memory cell towards the active layer.

14. The memory according to claim 7, further comprising:
a trench conductor having a lateral flank covered by the variable resistance element.

15. A memory comprising:
a first memory cell that includes:
a selection transistor having a control gate formed on a semiconductor layer and a first conduction terminal formed in the semiconductor layer, the control gate having a lateral flank;
a first insulating layer covering the lateral flank of the control gate; and
a variable-resistance element electrically coupled to and in contact with the first conduction terminal of the selection transistor at a lateral flank of the semiconductor layer, the variable-resistance element extending through the semiconductor layer and covering a lateral flank of the first insulating layer, the first insulating layer extending between the control gate and the variable-resistance element and electrically insulating the control gate from the variable-resistance element.

16. The memory according to claim 15, further comprising:
a second memory cell including:
a selection transistor that includes a control gate and a first conduction terminal, the control gate of the selection transistor of the second memory cell being formed on the semiconductor layer and having a lateral flank;
a second insulating layer covering the lateral flank of the control gate of the selection transistor of the second memory cell; and
a second variable-resistance element electrically coupled to and in contact with the first conduction terminal of the selection transistor of the second memory cell at a lateral flank of the semiconductor layer, the second variable-resistance element extending through the semiconductor layer and covering a lateral flank of the second insulating layer, the second insulating layer extending between the control gate of the selection transistor of the second memory cell and the second variable-resistance element and electrically insulating the control gate of the selection transistor of the second memory cell from the second variable-resistance element.

17. The memory according to claim 16, further comprising:
a shared trench conductor, the first and second variable-resistance elements being formed in a trench in the semiconductor layer, and the shared trench conductor having a first lateral flank covered by the first variable-resistance element and a second lateral flank covered by the second variable-resistance element.

18. The memory according to claim 16, wherein:
the selection transistors of the first and second memory cells share a second conduction terminal;
the selection transistor of the first memory cell includes a channel region positioned under the control gate of the selection transistor of the first memory cell and between the first conduction terminal of the selection transistor of the first memory cell and the second conduction terminal; and
the selection transistor of the second memory cell includes a channel region positioned under the control gate of the selection transistor of the second memory cell and between the first conduction terminal of the selection transistor of the second memory cell and the second conduction terminal.

19. The memory according to claim 15, further comprising:
a semiconductor substrate
a second insulating layer covering a surface of the semiconductor substrate and positioned between the semiconductor layer and the substrate.

20. The memory cell according to claim 15, further comprising a silicide barrier positioned between the semiconductor layer and the variable-resistance element, the silicide barrier being impermeable to diffusion of species present in the variable-resistance element towards the semiconductor layer.

21. The memory cell according to claim 17, further comprising:
a first spacer between a wall of the first variable resistance element and the shared trench conductor; and
a second spacer between a wall of the second variable resistance element and the shared trench conductor.

* * * * *